US006992473B2

(12) United States Patent
Marschalkowski et al.

(10) Patent No.: US 6,992,473 B2
(45) Date of Patent: Jan. 31, 2006

(54) CURRENT SENSING CIRCUIT FOR DC/DC BUCK CONVERTERS

(75) Inventors: Eric Marschalkowski, Inning (DE); John Malcolm, Headley Hants (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 158 days.

(21) Appl. No.: 10/751,795

(22) Filed: Jan. 5, 2004

(65) Prior Publication Data

US 2005/0127888 A1   Jun. 16, 2005

(30) Foreign Application Priority Data

Dec. 15, 2003  (EP) .................................. 03392013

(51) Int. Cl.
  *G05F 3/16*  (2006.01)
  *G05F 1/40*  (2006.01)
(52) U.S. Cl. ...................................... 323/315; 323/282
(58) Field of Classification Search ................ 323/268, 323/270, 271, 273, 277, 280, 282, 285, 290, 323/312, 315–317
  See application file for complete search history.

(56) References Cited

U.S. PATENT DOCUMENTS

| 4,465,967 | A | * | 8/1984 | Tokunaga et al. ........... 323/285 |
| 5,134,355 | A | * | 7/1992 | Hastings ..................... 323/211 |
| 5,378,998 | A | | 1/1995 | Davies ....................... 330/288 |
| 6,184,660 | B1 | | 2/2001 | Hatular ....................... 320/141 |
| 6,246,220 | B1 | * | 6/2001 | Isham et al. ................. 323/224 |
| 6,377,034 | B1 | | 4/2002 | Ivanov ........................ 323/287 |
| 6,381,159 | B2 | | 4/2002 | Oknaian et al. .............. 363/98 |
| 6,452,369 | B1 | | 9/2002 | Lang .......................... 323/285 |
| 6,600,362 | B1 | | 7/2003 | Gavrila ....................... 327/541 |
| 6,700,365 | B2 | * | 3/2004 | Isham et al. ................. 323/317 |
| 6,876,190 | B2 | * | 4/2005 | Tai et al. ................. 324/117 R |
| 2003/0218455 | A1 | | 11/2003 | Tai et al. .................... 323/316 |

FOREIGN PATENT DOCUMENTS

DE     3405599 A    8/1985
WO   WO 03/052433 A   6/2003

* cited by examiner

*Primary Examiner*—Matthew V. Nguyen
(74) *Attorney, Agent, or Firm*—George O. Saile; Stephen B. Ackerman

(57) ABSTRACT

A circuit and a related method to sense the inductor current of CD/DC buck converters have been achieved. The inductor current is sensed by generation of a voltage drop across a fully integrated sense resistor. The voltage drop is proportional to the inductor current in the pass device by supplying a fraction of the inductor current out of a source-follower, which matches to the pass device. The source of said source-follower is connected to a sense-resistor that is connected to the same supply as the pass device. The current, which is needed to generate the voltage drop, is fed back into the inductor current minimizing therefore the efficiency loss. Mirroring, amplification and offset correction of the voltage drop across the sense-resistor is performed by using a single matching pair of source-follower, which is supplied by a current tracking the internal reference voltage and the process variations of the resistors.

22 Claims, 2 Drawing Sheets

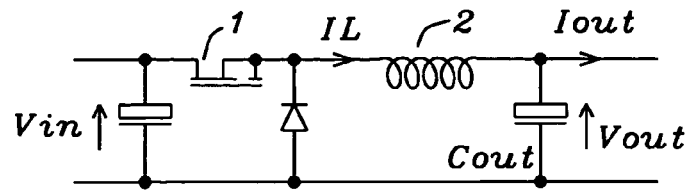
FIG. 1 – Prior Art
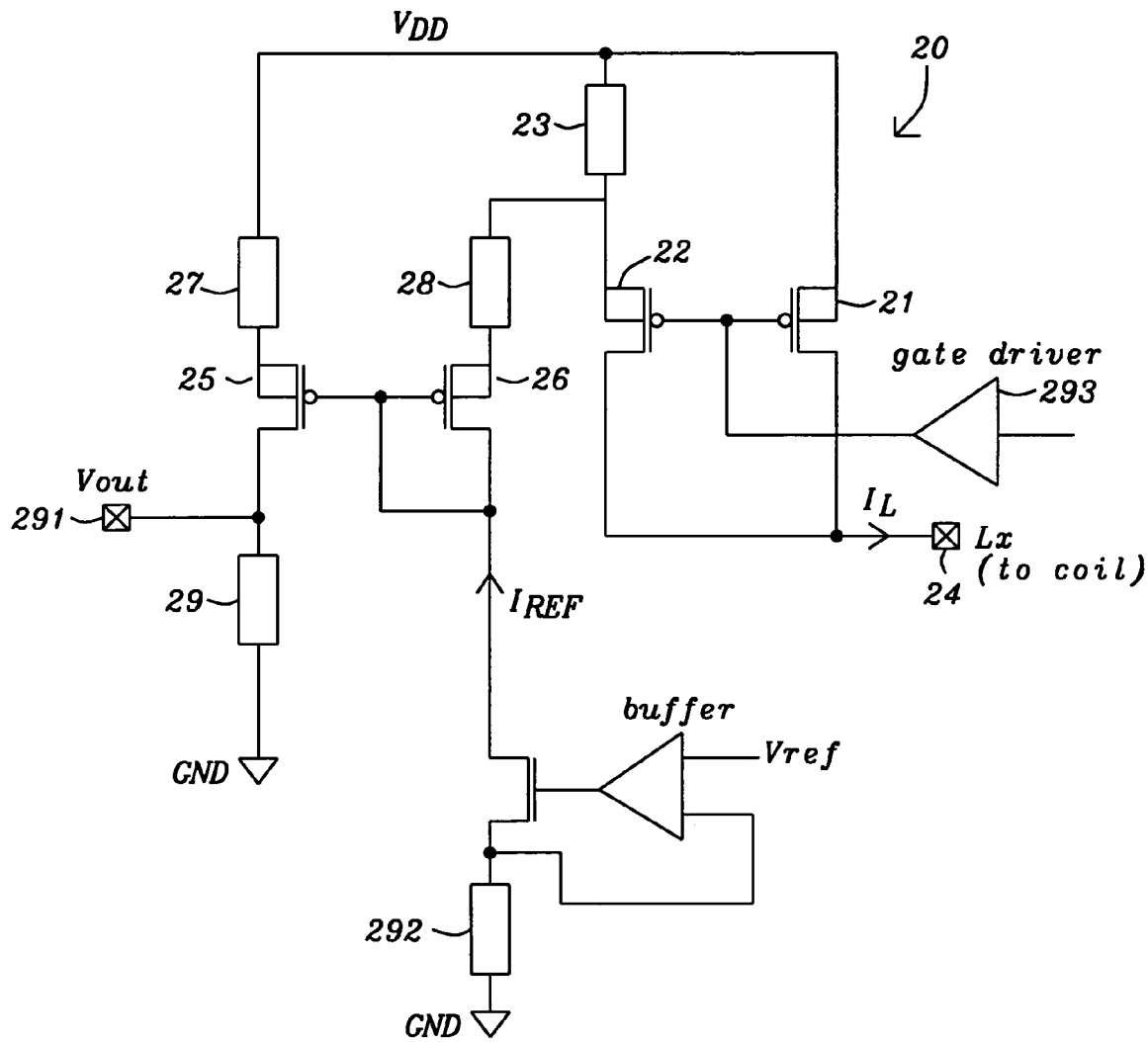
FIG. 2

CURRENT SENSING CIRCUIT FOR DC/DC BUCK CONVERTERS

BACKGROUND OF THE INVENTION (1) Field of the Invention

The present invention relates generally to voltage control unit circuits, and more particularly, to a current sense circuit for DC-DC buck converters.

(2) Description of the Prior Art

Current sense circuits are widely used in integrated circuits. If a potentially large output current, or load current, must be driven by an on-chip switch, a current sense circuit may be used to detect the relative or absolute value of this current. The current level may be monitored to prevent damage to the switch, or to the integrated circuit from either a short circuit or a simple overloading.

A buck converter converts an input voltage to a lower output voltage. Referring now to FIG. 1 prior art, a simplified schematic of a DC/DC buck converter is illustrated. The transistor 1 works as a switch, which is driven by a high frequency pulse-width-modulated control voltage. The switch is turned on and off by the pulse-width-modulated control voltage. During the on time of the transistor switch 1 the voltage $V_1$ is equal to $V_{in}$. Since $V_{in}$ is higher than $V_{ut}$ the current through the diode increases linearly in correspondence to Faraday's law. When the transistor is turned off (blocking phase) the diode takes the inductor current. At this time the voltage across the inductor inverts. The voltage $V_1$ becomes close to zero (taking into account the forward voltage drop it will be −0.7 V) and the voltage across the inductor 2 is now $-V_{out}$. The inductor current $I_L$ decreases linearly. The inductor current $I_L$ has a triangular shape, its average value is determined by the load.

As explained above it is important to sense the current via the power switch through the inductor to identify quickly overload situations. It is a challenge to the designers of such circuits to establish a current sensing circuit with a minimum efficiency loss, short settling time and good stability against process variations.

Current practice is either to measure the inductor current as a drop across a shunt resistor, or to measure it via an internal current mirror, which mirrors a fraction of the current into an internal circuit. The first method requires an additional external component and the loss of efficiency is given by the waste of power in the shunt resistor. The second method looses power, since the fraction of the mirrored inductor current is generated out of the power supply and is fed to ground. The adjustment of the operating point is currently done by using additional amplification stages.

Several prior art inventions describe current sensing circuits used in DC-DC buck converters:

U.S. Pat. No. 6,452,369 (to Lang) describes a self-oscillating buck converter including a controllable switch, a device for controlling the controllable switch, a device for sensing the output voltage of the buck converter, a device for sensing the output current of the buck converter, and a device for sensing the input voltage of the buck converter. The control device controls the controllable switch in such fashion that the output current level varies in dependence upon the output voltage and the input voltage.

U.S. Pat. No. 6,184,660 (to Hatular) discloses a battery charger IC for controlling operation of a buck converter circuit that includes a series switch and a resistor for sensing battery-charging current. The battery charger IC includes a pulse-width-modulation switch drive circuit that, during charging of the battery, supplies to the buck converter circuit with an electrical signal which repeatedly turns-on and then turns-off the series switch. The battery charger IC also includes a charging-current sense amplifier, which receives from the current-sensing resistor and amplifies an electrical signal, which represents the battery charging electrical current. The charging-current sense amplifier includes a bridge circuit to which is coupled the electrical signal received by the charging-current sense amplifier from the current-sensing resistor and an auto-zero circuit.

U.S. Pat. No. 6,381,159 (to Oknaian et al.) discloses a circuit and method for sensing the inductor current flowing to a load from a switching power supply without using a sense resistor in the path of the inductor current. In a synchronous buck converter topology, the inductor current is derived by sensing the voltage drop across the synchronous MOSFET of the half-bridge and reconstructing the current using a sample and hold technique. A ripple current synthesizer is employed to reconstruct inductor current outside the sample and hold window. A sampled product is used to update the ripple current estimator with dc information every switching cycle. The resulting voltage waveform is directly proportional to the inductor current. The inductor current synthesizer of the present invention can also be used in boost converter, flyback converter and forward converter topologies.

SUMMARY OF THE INVENTION

A principal object of the present invention is to achieve a current sense circuit for DC/DC buck converters with minimal efficiency loss, short settling time and good stability against process variations.

Another further object of the present invention is to achieve a method to sense efficiently the current of DC/DC buck converters.

In accordance with the objects of this invention a current-sensing circuit for DC/DC buck converters has been achieved. Said circuit comprises, first, a power supply voltage, a pass device, wherein its source is connected to said power supply voltage, its drain is connected to the inductor of said buck converter and its gate is connected to the gate of an source follower and to the output of a gate driver, a first means of resistance, which is connected between said power supply voltage and the source of a source follower whose gate is connected to the gate of said pass device, a first source follower, wherein its source is connected to said means of resistance, its gate is connected to the gate of said pass device, and its drain is connected to the inductor of said buck converter, and a gate driver wherein the output is connected to the gate of said pass device and to the gate of the said first source-follower. Furthermore said circuit comprises a second means of resistance which is connected between the source of said first source follower and the source of a second source follower, a second source follower, wherein its source is connected to said second means of resistance, its gate is connected to the gate of a third source follower, and its drain is connected to a current source, a current source, generating a current tracking a voltage reference, and a reference voltage. Additionally said circuit comprises a third source follower, wherein its gate is connected to the gate of said second source follower and to the drain of said second source follower, its drain is connected to a third means of resistance and to an output voltage, and its source is connected to a fourth means of resistance, a third means of resistance, being connected between the drain of said third source follower and ground, a fourth means of resistance, being connected between the source of said third source follower and said power supply voltage, and an output voltage tracking the amount of current being provided to the inductor of a DC/DC buck converter.

In accordance with the objects of the invention a method to sense the inductor current of a DC/DC buck converter has been achieved. Said method comprises, first, providing a pass device, four means of resistance, three source-followers, a current source, a gate driver and a reference voltage. The first steps of said method are to define a fraction of inductor current to flow across a sense means of resistance, to sense a voltage drop of a defined fraction of inductor current across a means of resistance, and to feed said defined fraction of inductor current back to inductor current after sensing the voltage drop. The next steps of the method invented are to adjust offset and amplification factor of a pair of source followers, to generate a reference current tracking a voltage reference and compensating for process variations, and to provide said voltage drop, amplified by said pair of source-followers, which is linearly proportional to the inductor current.

BRIEF DESCRIPTION OF THE DRAWINGS

In the accompanying drawings forming a material part of this description, there is shown:

FIG. 1 prior art shows a principal schematic of a DC/DC buck converter.

FIG. 2 shows a schematic of a current sense circuit for a DC/DC buck converter

DESCRIPTION OF THE PREFERRED EMBODIMENTS

Figure 3:
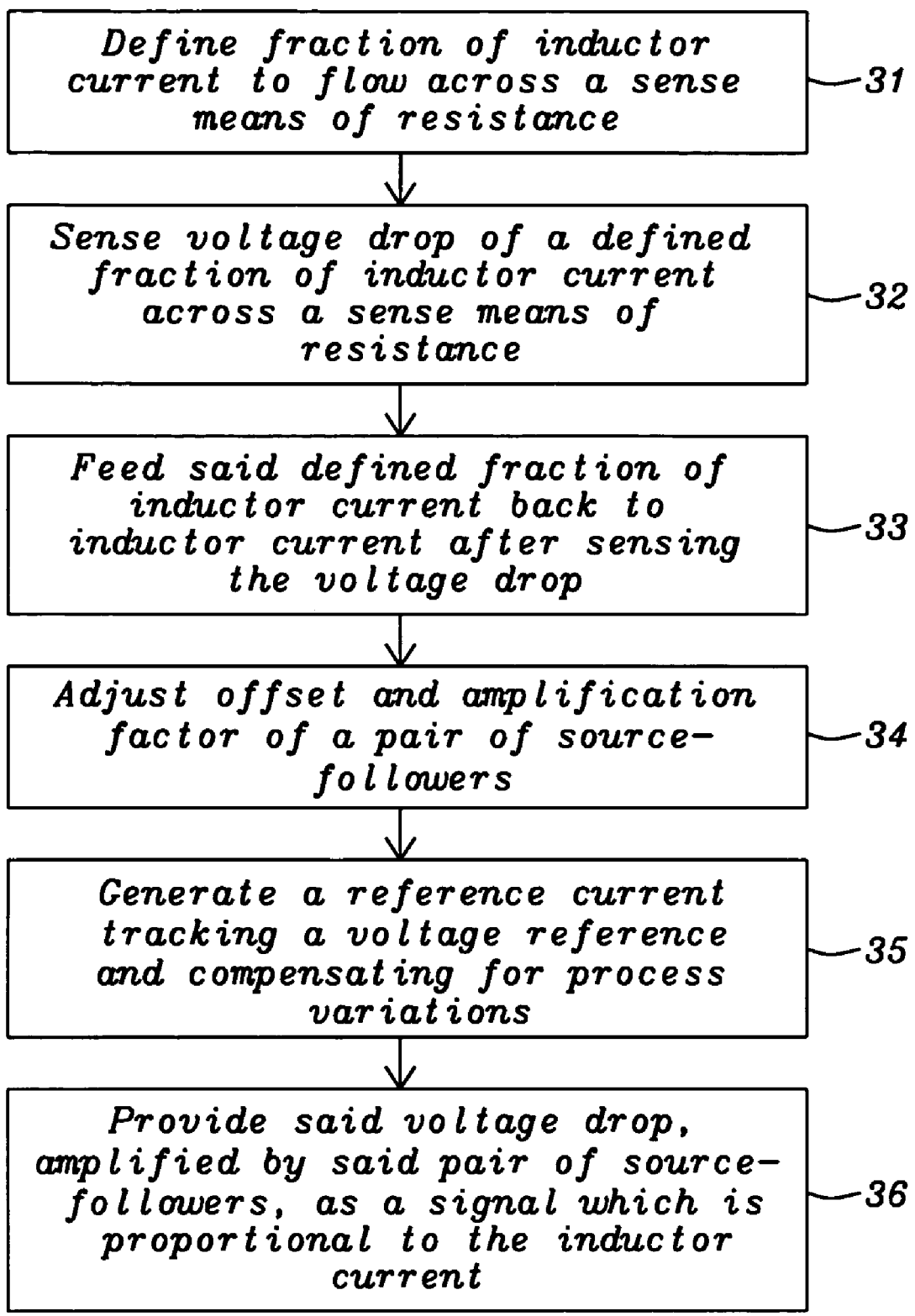
FIG. 3 shows a flowchart of a method to sense efficiently the inductor current of a DC/DC buck converter.

The preferred embodiments disclose a circuit and a method to sense the current through a transistor power switch and through the inductor of a DC-to-DC buck converter. It should be clear to those experienced in the art that the present invention can be applied and extended without deviating from the scope of the present invention.

Referring now to FIG. 2 an embodiment of a circuit of the present invention is illustrated. The current sensing circuit 20 of a DC/DC buck converter is performed by adding a PMOS source follower 22 to the PMOS pass device 21. A sense-resistor 23 is connected to the source of the source follower 22 and to the source of the pass device 21 and to the main supply voltage $V_{DD}$. The source of the pass device is also connected to $V_{DD}$. The drain of the pass device 21 and the drain of the source follower 22 are connected to a pin 24, which is connected to the external inductor (coil) of the DC/DC buck converter. The gate driver 293 defines the operation point and the switching of the PMOS pass device 21 and of the PMOS source follower 22. In a preferred embodiment a switching frequency of 1 MHz is used.

The fraction of the output current $I_L$, which is the inductor current in a buck converter, that is supplied by the source follower 22 is defined by the resistance of the sense-resistor 23 connected to its source and the geometrical relationship of the size of the source follower transistor 22 compared with the size of the pass device 21. The precision of said fraction is well defined by the parameters mentioned above.

The voltage drop across the sense-resistor 23 is mirrored with a second pair of PMOS source followers 25 and 26, working as a current mirror from one side of said pair to the other side. In order to adjust an offset and an amplification factor resistor 27 is added to the leg of source follower 25 and resistor 28 is added to the leg of source follower 26. The ratio of the resistance of resistors 27 and 28 adjusts the offset of the pair of source followers 25 and 26. Between the drain side of source follower 25, which is the output side of the current sense signal $V_{OUT}$ 291, and ground another resistor 29 is applied. The amplification factor of said pair of source followers 25 and 26 is defined. by the ratio of the resistance of resistor 27 to resistor 29. The output voltage Vout 291 represents the size of the current $I_L$ Using resistor 292 as a reference resistor a reference current $I_{REF}$ is created defining the operation point of said pair of source followers 25 and 26. Said reference current $I_{REF}$ tracks the voltage reference $V_{REF}$ and compensates for process variations.

A key point of the present invention is the generation of a voltage drop proportional to the current in the pass device by supplying a fraction of the inductor current $I_L$ out of the source follower 22, which matches the pass device 21 and its source is connected to a sense resistor 23 that is connected to the same supply as the pass device 21. The current which is needed to generate the voltage drop across the sense-resistor is fed back into the inductor current $I_L$, thus minimizing the efficiency loss.

Another important aspect of the present invention is that only a small fraction of the current through the pass device 21 is flowing through the sense resistor 23. Therefore said sense 23 resistor can easily be integrated in an integrated circuit.

Furthermore another main point of the present invention is that the mirroring, the amplification and offset correction of the voltage drop across the sense resistor 23 are performed by a single, matching pair of source-followers 25 and 26. Said pair of source followers 25 and 26 are supplied by a current tracking the internal reference voltage and the process variations of the resistors. An extreme short settling time of the amplification block is achieved by using said matching source follower pair 25 and 26. The definition of the operation point is included in the matching source follower amplifier by setting the ratio between both source resistors 27 and 28 and supplying it by a current tracking the voltage reference $V_{REF}$ as described above.

Another important aspect of the present invention is the independence of the circuit from manufacturing process variations. This independence is achieved by using matching resistors only and by a bias current tracking the reference voltage and tracking the absolute process variations of the resistors used.

Referring now to FIG. 3 a flowchart of a method how to sense the inductor current of a DC/DC buck converter is shown. The first step 31 shows the definition of a fraction of the inductor current which flows across a sense means of resistance. In a preferred embodiment of the present invention a resistor is used to sense the voltage drop. As described above the resistance of a sense resistor and the geometrical size of a source-follower define precisely the fraction of the inductor current. Step 32 describes the sensing of a voltage drop of said defined fraction of the inductor current across said sense means of resistance. Step 33 shows the feeding back of said fraction of inductor current into the inductor current. Therefore the energy loss caused by the sensing operation is absolutely minimized. Step 34 describes the adjustment of the offset and the amplification factor of a pair of source-followers. The following step 35 illustrates the generation of a reference current, which is tracking a voltage reference and compensating for manufacturing process variations. The last step 36 describes the provision of said voltage drop, amplified by said pair of source-followers, which is linearly proportional to the inductor current.

While the invention has been particularly shown and described with reference to the preferred embodiments thereof, it will be understood by those skilled in the art that various changes in form and details may be made without departing from the spirit and scope of the invention.

What is claimed is:

1. A current-sensing circuit for DC/DC buck converters comprising:
   a power supply voltage;
   a pass device, wherein its source is connected to said power supply voltage, its drain is connected to the inductor of said buck converter and its gate is connected to the gate of an source follower and to the output of a gate driver;
   a first means of resistance, which is connected between said power supply voltage and the source of a source follower whose gate is connected to the gate of said pass device;
   a first source follower, wherein its source is connected to said means of resistance, its gate is connected to the gate of said pass device, and its drain is connected to the inductor of said buck converter;
   a gate driver wherein the output is connected to the gate of said pass device and to the gate of the said first source-follower;
   a second means of resistance, which is connected between the source of said first source follower and the source of a second source follower;
   a second source follower, wherein its source is connected to said second means of resistance, its gate is connected to the gate of a third source follower, and its drain is connected to a current source;
   a current source, generating a current tracking a voltage reference;
   a reference voltage;
   a third source follower, wherein its gate is connected to the gate of said second source follower and to the drain of said second source follower, its drain is connected to a third means of resistance and to an output voltage, and its source is connected to a fourth means of resistance;
   a third means of resistance, being connected between the drain of said third source follower and ground;
   a fourth means of resistance, being connected between the source of said third source follower and said power supply voltage; and
   an output voltage tracking the amount of current being provided to the inductor of a DC/DC buck converter.

2. The circuit of claim 1 wherein said pass device is a PMOS pass device.

3. The circuit of claim 1 wherein said first source-follower is PMOS source follower.

4. The circuit of claim 1 wherein said first source-follower is PMOS source follower.

5. The circuit of claim 1 wherein said second source-follower is PMOS source follower.

6. The circuit of claim 1 wherein said third source-follower is PMOS source follower.

7. The circuit of claim 1 wherein said first means of resistance is a resistor.

8. The circuit of claim 1 wherein said second means of resistance is a resistor.

9. The circuit of claim 1 wherein said third means of resistance is a resistor.

10. The circuit of claim 1 wherein said fourth means of resistance is a resistor.

11. The circuit of claim 1 wherein said current source is comprising
    transistor, wherein its source is connected to the drain of said second source-follower, its base is connected to the output of a buffer amplifier, and its source is connected to a means of resistance and to a first input of said buffer amplifier;
    a first means of resistance being connected between the drain of said transistor and ground; and
    a buffer amplifier having an input and an output, wherein the output is connected to the gate of said transistor and a first input is connected to the drain of said transistor and a second input is a reference voltage.

12. The circuit of claim 11 wherein said means of resistance is a resistor.

13. A method to sense the inductor current of a DC/DC buck converter comprising:
    providing a pass device, four means of resistance, three source-followers, a current source, a gate driver and a reference voltage;
    define fraction of inductor current to flow across a sense means of resistance;
    sense voltage drop of a defined fraction of inductor current across a means of resistance;
    feed said defined fraction of inductor current back to inductor current after sensing the voltage drop;
    adjust offset and amplification factor of a pair of source followers;
    generate a reference current tracking a voltage reference and compensating for process variations; and
    provide said voltage drop, amplified by said pair of source-followers, which is linearly proportional to the inductor current.

14. The method of claim 13 wherein said fraction of inductor current is defined by the value of the sense means of resistance and the geometrical size of a source-follower compared to the size of the pass device.

15. The method of claim 13 wherein said sense means of resistance is a resistor.

16. The method of claim 13 wherein said fraction of inductor current is fed back to the inductor current via the drain of a source-follower matching the pass device and connected to the drain of the pass device.

17. The method of claim 13 wherein said offset is defined by the relation of means of resistance located in the each source of a pair of source-followers used to amplify said voltage drop.

18. The method of claim 17 wherein said pair of source-followers are a matching pair.

19. The method of claim 17 wherein said means of resistance are resistors.

20. The method of claim 13 wherein said amplification is defined by the relation of means of resistance located in the source and drain of the source-follower providing the output voltage of the sense-signal.

21. The method of claim 20 wherein said means of resistance are resistors.

22. The method of claim 13 wherein mirroring, amplifying and offset correction of said voltage drop is performed using a single pair of source-followers, which is supplied by a reference current tracking the internal reference voltage and the process variations of the means of resistance.

* * * * *